(12) United States Patent
Kim et al.

(10) Patent No.: US 12,745,625 B2
(45) Date of Patent: Sep. 22, 2026

(54) SEMICONDUCTOR DEVICE AND METHOD FOR FABRICATING THE SAME

(71) Applicant: SK hynix Inc., Gyeonggi-do (KR)

(72) Inventors: Seung Hwan Kim, Gyeonggi-do (KR); Myoung Jin Kang, Gyeonggi-do (KR); Kyung Hoon Min, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 739 days.

(21) Appl. No.: 17/989,115

(22) Filed: Nov. 17, 2022

(65) Prior Publication Data

US 2023/0413517 A1 Dec. 21, 2023

(30) Foreign Application Priority Data

Jun. 20, 2022 (KR) ........................ 10-2022-0075050

(51) Int. Cl.

*H10W 20/46* (2026.01)
*H10B 12/00* (2023.01)
*H10W 20/00* (2026.01)
*H10W 20/41* (2026.01)

(52) U.S. Cl.

CPC ............ *H10W 20/46* (2026.01); *H10B 12/50* (2023.02); *H10W 20/072* (2026.01); *H10W 20/435* (2026.01)

(58) Field of Classification Search

CPC ................ H10D 64/687; H10D 64/679; H01L 21/7862; H01L 2221/1042–1047; H01L 2221/1047; H10W 20/072

See application file for complete search history.

(56) References Cited

U.S. PATENT DOCUMENTS

2013/0292847 A1* 11/2013 Choi .................. H01L 21/7682 257/774
2016/0181143 A1* 6/2016 Kwon ................ H01L 21/7682 438/586
2020/0043941 A1 2/2020 Kim et al.
2021/0183862 A1* 6/2021 Son ....................... H10B 12/30
2022/0013524 A1 1/2022 Ryu et al.

FOREIGN PATENT DOCUMENTS

KR 10-2013-0123687 A 11/2013
KR 10-2014-0032219 A 3/2014
KR 10-2021-0077098 A 6/2021
KR 10-2022-0077741 A 6/2022

OTHER PUBLICATIONS

Office Action for Korean Patent Application No. 10-2022-0075050 issued by the Korean Patent Office on Jan. 8, 2026.

* cited by examiner

*Primary Examiner* — Amar Movva
(74) *Attorney, Agent, or Firm* — IP&T GROUP LLP

(57) ABSTRACT

A semiconductor device includes: active layers vertically stacked over a substrate; word lines extending in a direction crossing the active layers over the active layers; a bit line commonly coupled to first sides of the active layers and extending in a direction perpendicular to the substrate; storage nodes of a data storage element that are vertically stacked over the substrate while being coupled to second sides of the active layers, respectively; and vertical isolation layers including air gaps disposed between the bit lines.

18 Claims, 16 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2022-0075050, filed on Jun. 20, 2022, which is incorporated herein by reference in its entirety.

BACKGROUND

1. Field

Various embodiments of the present invention relate to a semiconductor device, and more particularly, to a semiconductor device of a three-dimensional structure and a method for fabricating the same.

2. Description of the Related Art

Recently, in order to cope with the demand for large capacity and miniaturization of memory devices, a technique for providing a three-dimensional (3D) memory device in which a plurality of memory cells are stacked are being proposed.

SUMMARY

Embodiments of the present invention are directed to a semiconductor device including highly integrated memory cells, and a method for fabricating the semiconductor device.

In accordance with an embodiment of the present invention, a semiconductor device includes: a plurality of conductive lines vertically oriented over a substrate; and a plurality of vertical isolation layers disposed between the conductive lines, the vertical isolation layers each including an air gap extending vertically.

In accordance with another embodiment of the present invention, a semiconductor device includes: active layers vertically stacked over a substrate; word lines extending in a direction crossing the active layers over the active layers; a bit line commonly coupled to first sides of the active layers and extending in a direction perpendicular to the substrate; storage nodes of a data storage element that are vertically stacked over the substrate while being coupled to second sides of the active layers, respectively; and vertical isolation layers including air gaps disposed between the bit lines.

In accordance with another embodiment of the present invention, a semiconductor device includes: a lower structure; a plurality of semiconductor layers oriented laterally in a direction parallel to the surface of the lower structure; a plurality of first conductive lines respectively coupled to first-side ends of the semiconductors and extending in a direction perpendicular to the surface of the lower structure; second conductive lines extending laterally in a direction crossing the semiconductor layers over the semiconductor layers; and an isolation layer including an air gap extending in the direction perpendicular to the surface of the lower structure to be disposed between the first conductive lines.

In accordance with another embodiment of the present invention, a method for fabricating a semiconductor device includes: forming a stack body including a first dielectric layer, a first sacrificial layer, a semiconductor layer, a second sacrificial layer, and a second dielectric layer over a substrate; forming a plurality of openings by etching a first region of the stack body; forming a plurality of vertical isolation layers respectively filling the openings and including vertically extending sacrificial spacers; and replacing the sacrificial spacer with an air gap.

In accordance with another embodiment of the present invention, a semiconductor device includes: a lower structure; a plurality of dielectric pillars extending in a first direction perpendicular to the surface of the lower structure and spaced apart from each other in a second direction in a lateral direction perpendicular to the first direction; and a plurality of conductive lines formed in a space between the dielectric pillars in the second direction and extending vertically in the first direction, wherein each of the dielectric pillars includes an air gap extending vertically in the first direction.

In accordance with another embodiment of the present invention, a method for fabricating a semiconductor device includes: forming a stack structure over a lower structure; forming a plurality of isolation layers extending vertically through the stack structure and including a sacrificial material; replacing the embedded sacrificial material with an embedded air gap; and forming bit lines that are disposed between the embedded air gaps of the isolation layers and oriented vertically from the lower structure.

In accordance with another embodiment of the present invention, a method for fabricating a semiconductor device includes: forming a stack structure over a lower structure; forming an opening by etching the stack structure; forming a plurality of isolation layers that fill the opening and include a liner layer and a sacrificial material over the liner layer; replacing the sacrificial material with an embedded air gap; and forming bit lines disposed between the air gaps of the isolation layers and oriented vertically from the lower structure.

In accordance with another embodiment of the present invention, a method for fabricating a semiconductor device may include: forming a plurality of sacrificial layers over a substrate; forming a plurality of vertical isolation layers including a sacrificial material passing vertically through the sacrificial layers to expose the substrate; forming identical air gaps on opposite sides of each of the vertical isolation layers by selectively removing the sacrificial material adjacent to each of the vertical isolation layers; forming a vertical conductive lines between each pair of consecutive vertical isolation layers; and replacing the sacrificial layers of the stack body with lateral conductive lines.

In accordance with another embodiment of the present invention, a method for fabricating a semiconductor device may include forming a stack body including a plurality of sacrificial layers over a substrate; forming a plurality of vertical isolation layers including a sacrificial material in the stack body; forming an air gap in each of the vertical isolation layers by selectively removing the sacrificial material; forming a plurality of vertical conductive lines passing through the stack body between the vertical isolation layers; and replacing the sacrificial layers of the stack body with lateral conductive lines. The sacrificial material may include amorphous carbon. The forming of the plurality of the vertical isolation layers including the sacrificial material in the stack body may include: forming vertical openings by etching the stack body; forming a liner layer on surfaces of the vertical openings; forming an amorphous carbon layer over the liner layer; selectively etching the amorphous carbon layer to form a spacer of the sacrificial material; and forming a gap-fill layer that fills the vertical openings over the spacer of the sacrificial material. The method further includes after the forming of the gap-fill layer, recessing top surfaces of the spacer of the sacrificial material and the gap-fill layer; and forming a capping layer that covers the top surface of the recessed spacer of the sacrificial material and the top surface of the recessed gap-fill layer. The forming of the air gap in each of the vertical isolation layers by selectively removing the sacrificial material may include performing a plasma treatment to remove the sacrificial material. The sacrificial material may include amorphous carbon, and the plasma treatment is performed in an atmosphere of oxygen. The forming of the plurality of the vertical isolation layers including the sacrificial material in the stack body and the forming of the air gap in each of the vertical isolation layers by selectively removing the sacrificial material may include: forming vertical openings by etching the stack body; forming a liner layer on surfaces of the vertical openings; forming an amorphous carbon layer that fills the vertical openings over the liner layer to form the sacrificial material; and removing the amorphous carbon layer to form the air gap. The air gaps have a shape exposing sidewalls of the vertical conductive lines. The vertical isolation layers further include a liner layer between the air gaps and the vertical conductive lines.

These and other features and advantages of the present invention will become better understood to those skilled in the art from the detailed description of specific embodiment of the invention in conjunction with the accompanying drawings.

DETAILED DESCRIPTION

Figure 1:
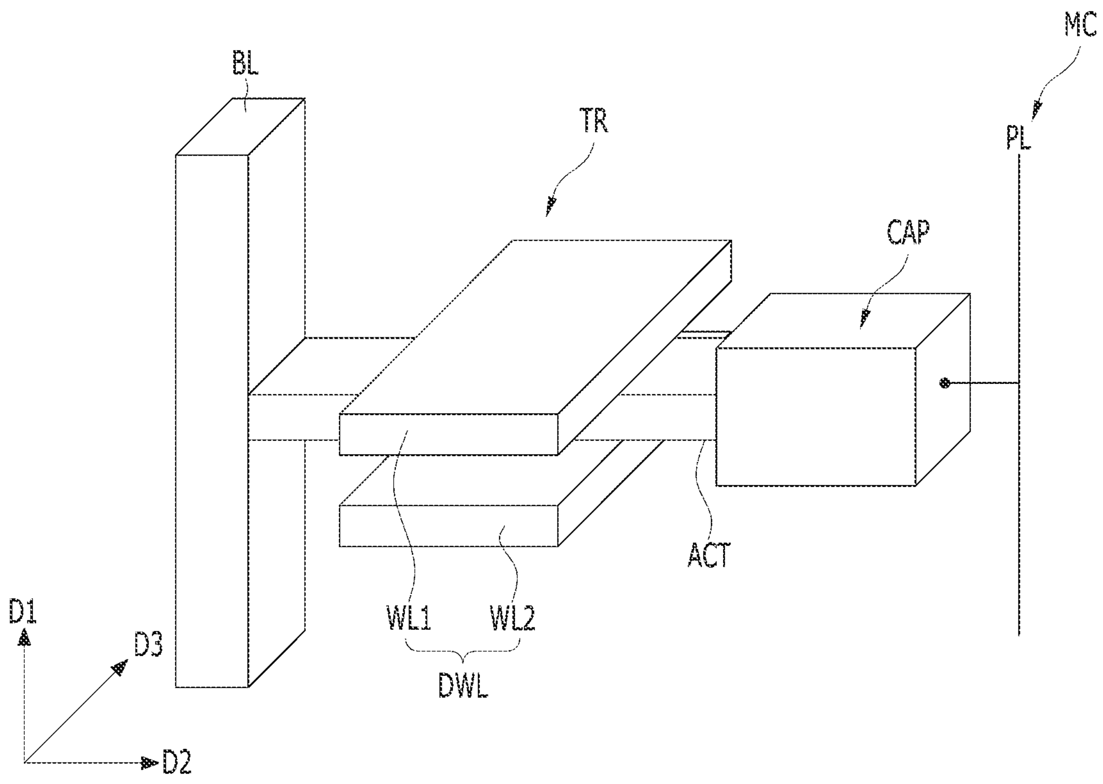
FIG. 1 is a simplified schematic perspective view illustrating a memory cell of a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to the following embodiments of the present invention, it is possible to increase the memory cell density and reduce parasitic capacitance by vertically stacking memory cells.

Figure 2:
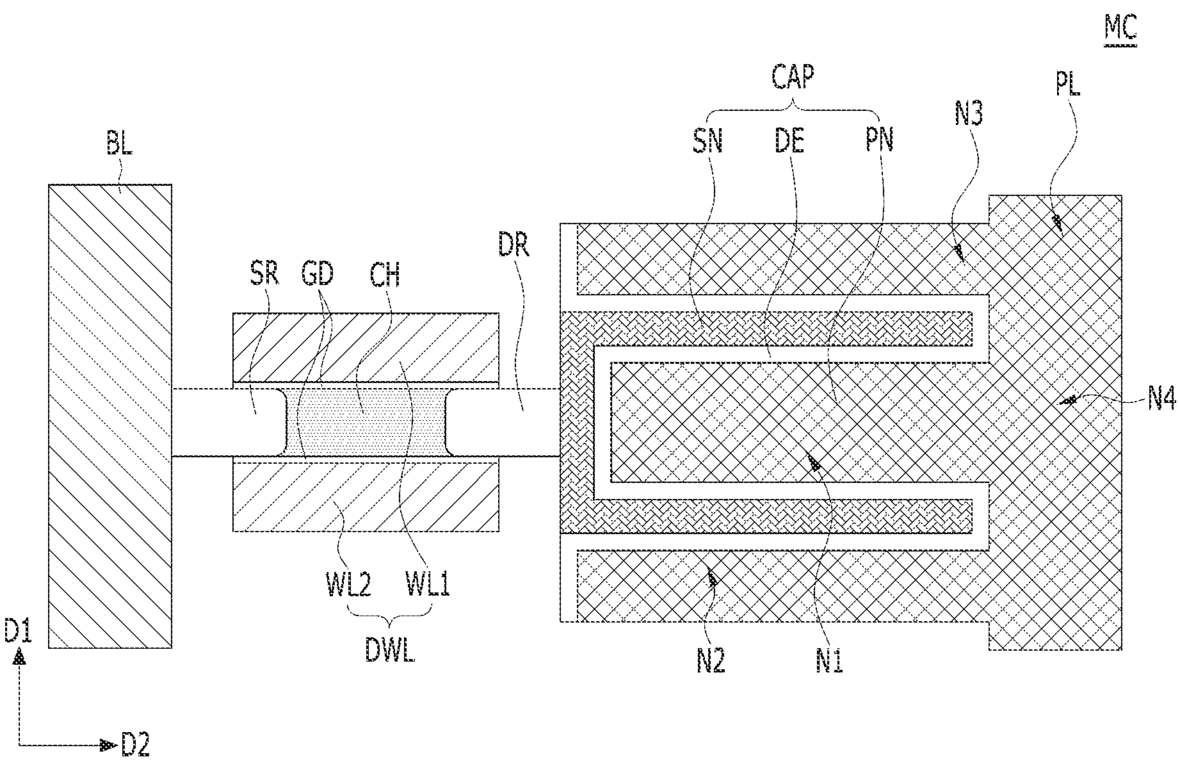
FIG. 2 is a simplified schematic cross-sectional view illustrating the memory cell shown in FIG. 1.

FIG. 1 is a simplified schematic perspective view illustrating a memory cell of a semiconductor device in accordance with an embodiment of the present invention. FIG. 2 is a simplified schematic cross-sectional view illustrating the memory cell shown in FIG. 1.

Referring to FIGS. 1 and 2, the memory cell MC of a three-dimensional (3D) semiconductor device according to the embodiments of the present invention may include a vertical conductive line BL, a switching element TR, and a data storage element CAP. The switching element TR may include a lateral layer ACT, a gate dielectric layer GD, and a lateral conductive line DWL. The switching element TR may include a transistor. The term "lateral" as used here means extending in a horizontal or sideways direction D2 that is perpendicular to a vertical direction D1. Hereinafter, the switching element TR may be a transistor TR. The data storage element CAP may include a memory element, such as a capacitor CAP. The data storage element CAP may be a capacitor CAP. The vertical conductive line BL may be a bit line BL. Also, the lateral conductive line DWL may be a word line DWL, and the lateral layer ACT may be an active layer ACT. The capacitor CAP may include a storage node SN, a dielectric layer DE, and a plate node PN.

The bit line BL may have a pillar shape extending in the first direction D1. The active layer ACT may have a bar shape extending in the second direction D2 intersecting with the first direction D1. The word line DWL may have a line shape extending in a third direction D3 intersecting with the first and second directions D1 and D2 in an orthogonal manner. The plate node PN of the capacitor CAP may be coupled to a plate line PL.

The bit line BL may be vertically oriented in the first direction D1. The bit line BL may be referred to as a vertically oriented bit line or a pillar-type bit line. The bit line BL may include a conductive material. For, example, the bit line BL may include a silicon-based material, a metal-based material, or a combination thereof. The bit line BL may include silicon, a metal, a metal nitride, a metal silicide, or a combination thereof. The bit line BL may include polysilicon, titanium nitride, tungsten, or a combination thereof. For example, the bit line BL may include polysilicon or titanium nitride (TiN) which is doped with an N-type impurity. The bit line BL may include a TiN/W stack including titanium nitride and tungsten over titanium nitride.

The word line DWL may extend in a third direction D3, and the active layer ACT may extend in the second direction D2. The active layer ACT may be laterally arranged in the second direction D2 from the bit line BL. The word line DWL may include a pair of word lines, that is, a first word line WL1 and a second word line WL2. The first word line WL1 and the second word line WL2 may face each other in the first direction D1 with the active layer ACT interposed therebetween. A gate dielectric layer GD may be formed on the upper (top) and lower (bottom) surfaces of the active layer ACT.

The active layer ACT may include a semiconductor material. The active layer ACT may include an oxide semiconductor material. For example, suitable materials for the active layer ACT may include monocrystalline silicon, germanium, silicon germanium, or indium gallium zinc oxide (IGZO). The active layer ACT may include a channel CH, a first source/drain region SR between the channel CH and a bit line BL, and a second source/drain region DR between the channel CH and a capacitor CAP. The channel CH may be defined between the first source/drain region SR and the second source/drain region DR. The length of the channel CH in the second direction D2 may be greater than the length of each of the first and second source/drain regions SR and DR.

The first and second source/drain regions SR and DR may be doped with impurities. The first and second source/drain regions SR and DR may be doped with impurities of the same conductivity type. The first and second source/drain regions SR and DR may be doped with an N-type impurity. The first and second source/drain regions SR and DR may be doped with a P-type impurity. The first and second source/drain regions SR and DR may include at least one impurity which is selected among arsenic (As), phosphorus (P), boron (B), indium (In), and a combination thereof. The first source/drain region SR may contact the bit line BL. The second source/drain region DR may contact the storage node SN.

The transistor TR may be a cell transistor. The same voltage may be applied to the first word line WL1 and the second word line WL2. For example, the first word line WL1 and the second word line WL2 may be a pair, and the same word line driving voltage may be applied to the first word line WL1 and the second word line WL2. As described, the memory cell MC according to the embodiment of the present invention may have a double word line structure in which two first and second word lines WL1 and WL2 are disposed adjacent to one channel CH.

According to another embodiment of the present invention, different voltages may be applied to the first word line WL1 and the second word line WL2. For example, a word line driving voltage may be applied to the first word line WL1, and a ground voltage may be applied to the second word line WL2. The second word line WL2 may be referred to as a back word line or a shield word line. According to another embodiment of the present invention, the ground voltage may be applied to the first word line WL1, and the word line driving voltage may be applied to the second word line WL2.

The active layer ACT may have a smaller thickness than those of each of the first and second word lines WL1 and WL2. In other words, the vertical thickness of the active layer ACT in the first direction D1 may be smaller than the vertical thickness of each of the first and second word lines WL1 and WL2 in the first direction D1. The active layer ACT may be a thin active layer or a thin-body active layer. The thin active layer ACT may include a thin-body channel CH, and the thin-body channel CH may have a thickness of approximately 10 nm or less. According to another embodiment of the present invention, the channel CH may have the same vertical thickness as each of the first and second word lines WL1 and WL2.

The gate dielectric layer GD may include, for example, silicon oxide, silicon nitride, a metal oxide, a metal oxynitride, a metal silicate, a high-k material, a ferroelectric material, an anti-ferroelectric material or a combination thereof. The gate dielectric layer GD may include $SiO_2$, $Si_3N_4$, $HfO_2$, $Al_2O_3$, $ZrO_2$, AlON, HfON, HfSiO, HfSiON, or HfZrO.

Suitable materials for the first and second word lines WL1 and WL2 of the word line DWL may include a metal, a metal mixture, a metal alloy, or a semiconductor material. The first and second word lines WL1 and WL2 of the word line DWL may include, for example, titanium nitride, tungsten, polysilicon, or a combination thereof. For example, the first and second word lines WL1 and WL2 of the word line DWL may include a TiN/W stack in which titanium nitride and tungsten are sequentially stacked. The first and second word lines WL1 and WL2 of the word line DWL may include an N-type work function material. The first and second word lines WL1 and WL2 of the word line DWL may include a P-type work function material. The N-type work function material may have a low work function. The N-type work function material may have a low work function of approximately 4.5 eV or less. The P-type work function material may have a high work function. The P-type work function material may have a high work function of approximately 4.5 eV or more.

The capacitor CAP may be disposed laterally from the transistor TR in the second direction D2. The capacitor CAP may include a storage node SN that extends laterally from the active layer ACT in the second direction D2. The capacitor CAP may further include a dielectric layer DE and a plate node PN over the storage node SN. The storage node SN, the dielectric layer DE, and the plate node PN may be arranged laterally in the second direction D2. The storage node SN may have a laterally oriented cylinder shape. The dielectric layer DE may conformally cover the cylindrical inner wall and the cylindrical outer wall of the storage node SN. The plate node PN may have a shape extending to the cylindrical inner wall and the cylindrical outer wall of the storage node SN over the dielectric layer DE. The plate node PN may be coupled to the plate line PL. The storage node SN may be electrically connected to the second source/drain region DR.

The storage node SN may have a three-dimensional structure, oriented in the second direction D2. As an example of the three-dimensional structure, the storage node SN may have a cylindrical shape. According to another embodiment of the present invention, the storage node SN may have a pillar shape or a pylinder shape. The pylinder shape may refer to a structure in which a pillar shape and a cylinder shape are merged.

The plate node PN may include an internal node N1 and external nodes N2, N3, and N4. The internal node N1 and the external nodes N2, N3, and N4 may be coupled to each other. The internal node N1 may be disposed inside the cylinder of the storage node SN. The external nodes N2 and N3 may be disposed outside the cylinder of the storage node SN with the dielectric layer DE interposed therebetween. The external node N4 may couple the internal node N1 and the external nodes N2 and N3 to each other. The external nodes N2 and N3 may be disposed to surround the cylindrical outer wall of the storage node SN. The external node N4 may serve as a plate line PL.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include, for example, titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, a tungsten nitride/tungsten (WN/W) stack. The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the cylindrical inside of the storage node SN over the titanium nitride, and titanium nitride (TiN) may serve as a plate node PN of a capacitor CAP, and tungsten nitride may be a low-resistance material.

The dielectric layer DE may include, for example, silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the aforementioned high-k materials.

The dielectric layer DE may be formed of zirconium (Zr)-based oxide. The dielectric layer DE may have a stack structure including at least zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. According to another embodiment of the present invention, the dielectric layer DE may be formed of hafnium (Hf)-based oxide. The dielectric layer DE may have a stack structure including at least hafnium oxide ($HfO_2$). The stack structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater bandgap energy (which will be, hereinafter, simply referred to as bandgap) than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a greater bandgap than the high-k material. The dielectric layer DE may include, for example, silicon oxide ($SiO_2$) as a high bandgap material other than aluminum oxide ($Al_2O_3$). Since the dielectric layer DE includes a high bandgap material, leakage current may be suppressed. The high-bandgap material may be thinner than the high-k material. According to another embodiment of the present invention, the dielectric layer DE may include a laminated structure in which a high-k material and a high-bandgap material are alternately stacked. For example, it may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to another embodiment of the present invention, the dielectric layer DE may include a stack structure, a laminated structure, or a mixed structure including zirconium oxide, hafnium oxide, and aluminum oxide.

According to another embodiment of the present invention, the dielectric layer DE may include a ferroelectric material or an antiferroelectric material.

According to another embodiment of the present invention, an interface control layer for improving leakage current may be further formed between the storage node SN and the dielectric layer DE. The interface control layer may include, for example, titanium oxide ($TiO_2$), niobium oxide, or niobium nitride. The interface control layer may also be formed between the plate node PN and the dielectric layer DE.

The capacitor CAP may include a metal-insulator-metal (MIM) capacitor. The storage node SN and the plate node PN may include a metal-based material.

The capacitor CAP may be replaced with another data storage material. For example, the data storage material may be a phase change material, a magnetic tunnel junction (MTJ), or a variable resistance material.

Figure 3:
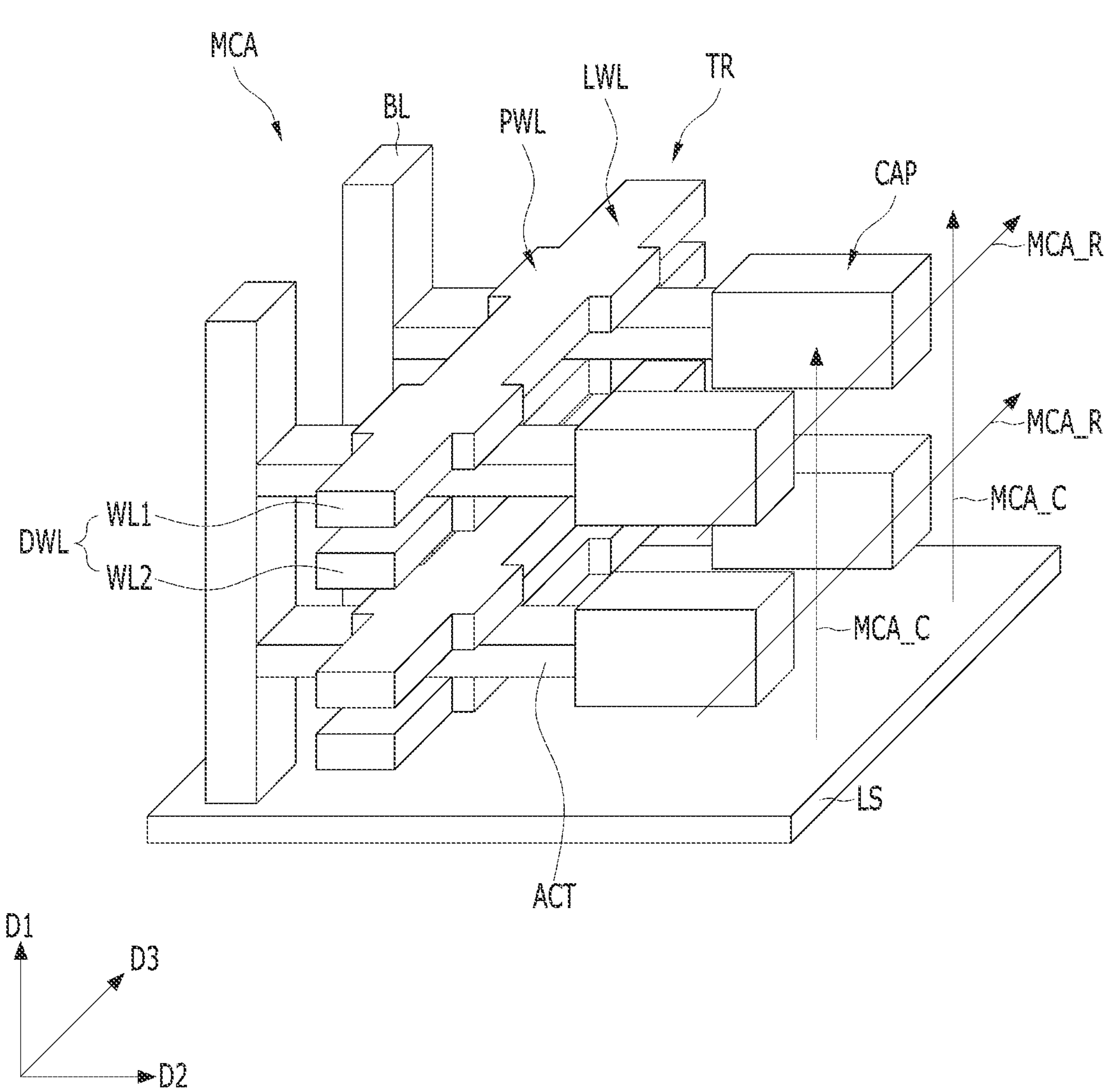
FIG. 3 is a simplified schematic perspective view illustrating a semiconductor device in accordance with an embodiment of the present invention.
Figure 4:
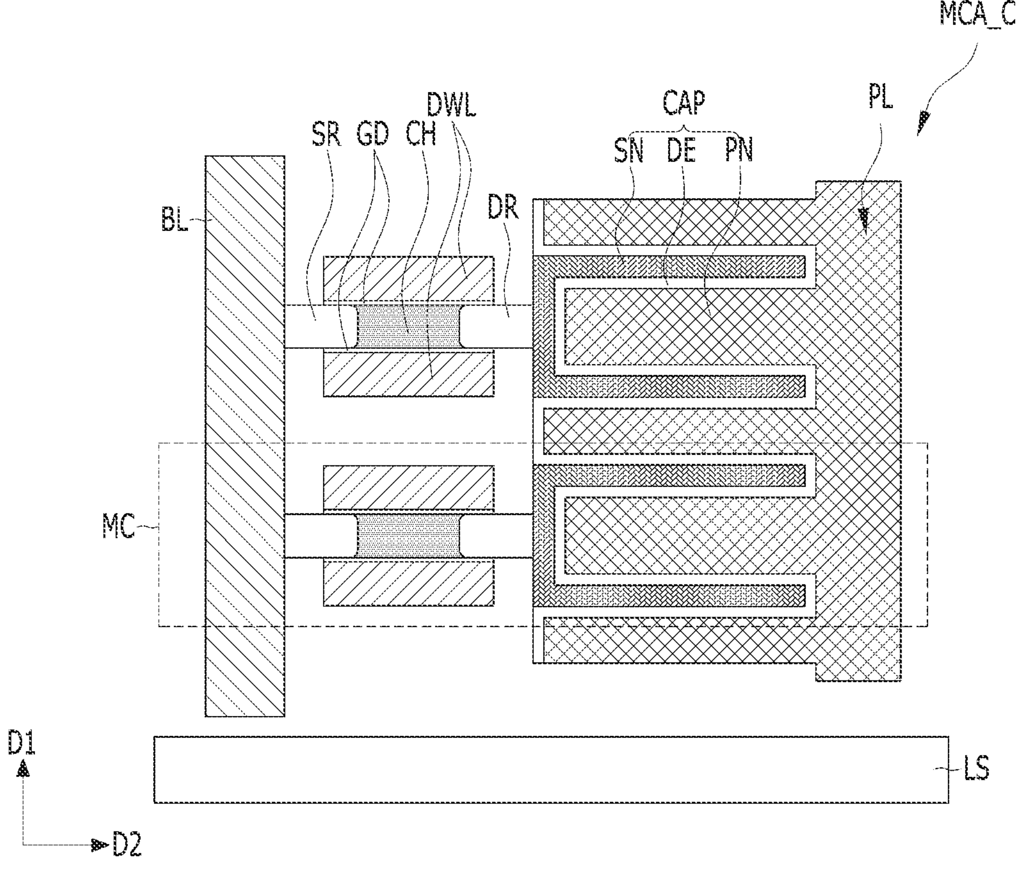
FIG. 4 is a simplified schematic cross-sectional view illustrating a memory cell array of a semiconductor device in accordance with another embodiment of the present invention.

FIG. 3 is a simplified schematic perspective view illustrating a semiconductor device in accordance with an embodiment of the present invention. FIG. 4 is a simplified schematic cross-sectional view illustrating a vertical memory cell array MCA_C shown in FIG. 3.

Referring to FIGS. 3 and 4, the semiconductor device 100 may include a lower structure LS and a memory cell array MCA. A plurality of memory cells MC shown in FIG. 1 may be arranged in the first to third directions D1, D2, and D3 to form the memory cell array MCA shown in FIG. 3. The memory cell array MCA may include a three-dimensional array of memory cells MC, and the three-dimensional memory cell array may include a vertical memory cell array MCA_C and a lateral memory array MCA_R. The vertical memory cell array MCA_C may refer to an array of memory cells MC that are vertically arranged in the first direction D1. The lateral memory cell array MCA_R may refer to an array of memory cells MC that are arranged laterally in the third direction D3. The vertical memory cell array MCA_C may be referred to as a column array of memory cells MC, and the lateral memory cell array MCA_R may be referred to as a row array of memory cells MC. The bit line BL may be vertically oriented to be coupled to the vertical memory cell array MCA_C, and the double word line DWL may be oriented laterally to be coupled to the lateral memory cell array MCA_R. The bit line BL coupled to the vertical memory cell array MCA_C may be referred to as a common bit line, and the vertical memory cell arrays MCA_C that are disposed adjacent to each other in the third direction D3 may be coupled to different common bit lines. The double word line DWL coupled to the lateral memory cell array MCA_R may be referred to as a common double word line Common DWL, and the lateral memory cell arrays MCA_R that are disposed adjacent to each other in the first direction D1 may be coupled to different common double word lines.

The memory cell array MCA may include a plurality of memory cells MC, and each memory cell MC may include a vertically oriented bit line BL, a laterally oriented active layer ACT, a word line DWL, and a capacitor CAP. For example, FIG. 3 illustrates a three-dimensional DRAM memory cell array including four memory cells MC.

The active layers ACT that are disposed adjacent to each other in the first direction D1 may contact one bit line BL. Active layers ACT that are disposed adjacent to each other in the third direction D3 may share the double word line DWL. The capacitors CAP may be respectively coupled to the active layers ACT. The capacitors CAP may share one plate line PL. The individual active layers ACT may be thinner than the first and second word lines WL1 and WL2 of the word line DWL.

In the memory cell array MCA, a plurality of word lines DWL may be vertically stacked in the first direction D1. The individual word line DWL may include a pair of a first word line WL1 and a second word line WL2. Between the first word line WL1 and the second word line WL2, a plurality of active layers ACT may be laterally arranged to be spaced apart from each other in the third direction D3. The channel CH of the active layer ACT may be disposed between the first word line WL1 and the second word line WL2. The word line DWL may include a line shape portion LWL and a protrusion portion PWL. The protrusion portion PWL may overlap with the active layer ACT. The word line DWL of FIG. 1 may also include a line shape portion LWL and a protrusion portion PWL. Since the word line DWL includes the line shape portion LWL and the protrusion portion PWL, it may have a notch-shaped sidewall. The notched sidewall of the word line DWL may include a plurality of flat surfaces and a plurality of recessed surfaces.

Figure 5:
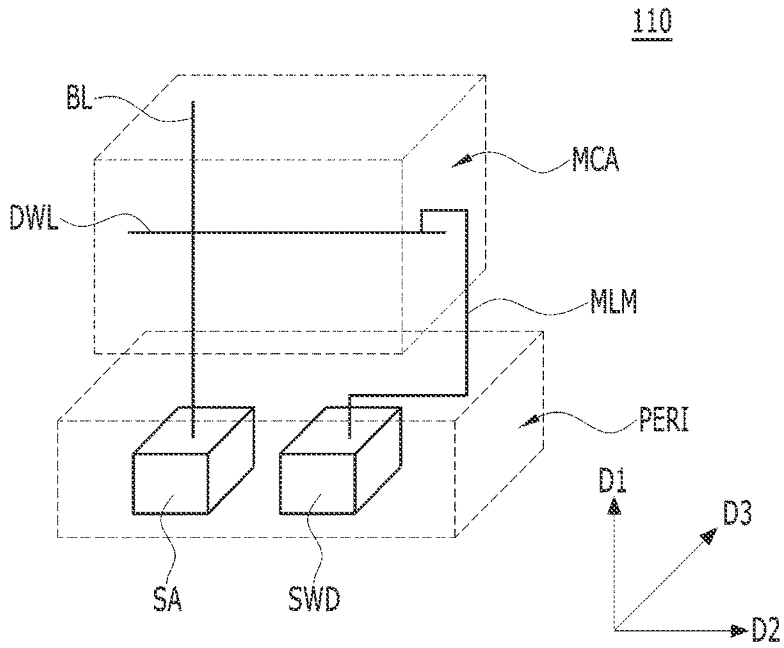
FIGS. 5 and 6 are simplified perspective schematic views illustrating semiconductor devices in accordance with other embodiments of the present invention.
Figure 6:
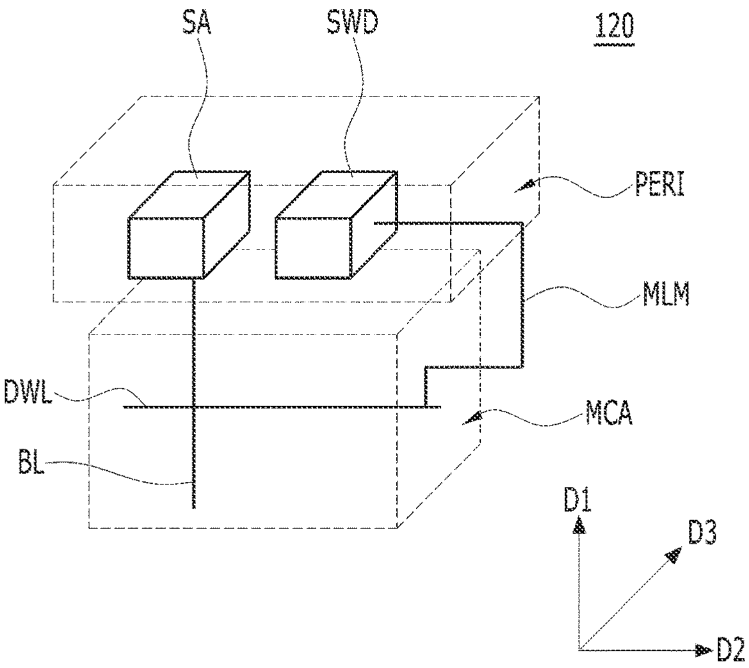

FIGS. 5 and 6 simplified perspective schematic views illustrating memory cell arrays of semiconductor devices in accordance with other embodiments of the present invention. FIG. 5 illustrates a semiconductor device 110 of a COP (Cell-Over-Peripheral) structure, and FIG. 6 illustrates a semiconductor device 120 of a POC (Peripheral-Over-Cell) structure. Detailed descriptions on the constituent elements also appearing in FIG. 5 in FIG. 6 will be omitted. In FIG. 5, a peripheral circuit portion PERI may correspond to the lower structure LS shown in FIG. 3. Referring to FIG. 5, the semiconductor device 110 may include a peripheral circuit portion PERI, and the peripheral circuit portion PERI may be disposed at a lower level than the memory cell array MCA. This may be referred to as a COP (Cell-Over-Peripheral) structure. A bit line BL of the memory cell array MCA may be oriented vertically in the first direction D1 with respect to the surface of the peripheral circuit portion PERI, and a word line DWL may be oriented parallel to the surface of the peripheral circuit portion PERI in the third direction D3.

Referring to FIG. 6, the semiconductor device 120 may include a memory cell array MCA and a peripheral circuit portion PERI. The peripheral circuit portion PERI may be disposed at a higher level than the memory cell array MCA. This may be referred to as a POC (Peripheral-Over-Cell) structure.

In FIGS. 5 and 6, the peripheral circuit portion PERI may include at least one control circuit for driving the memory cell array MCA. The at least one control circuit of the peripheral circuit portion PERI may include an N-channel transistor, a P-channel transistor, a CMOS circuit, or a combination thereof. The at least one control circuit of the peripheral circuit portion PERI may include an address decoder circuit, a read circuit, a write circuit, and the like. The at least one control circuit of the peripheral circuit portion (PERI) may include a planar channel transistor, a recess channel transistor, a buried gate transistor, and a fin channel transistor (FinFET) and the like.

For example, the peripheral circuit portion PERI may include a sub-word line driver SWD and a sense amplifier SA. The word line DWL may be coupled to the sub-word line driver SWD through a multi-level metal interconnection MLM. The bit lines BL may be coupled to the sense amplifier SA.

Figure 7:
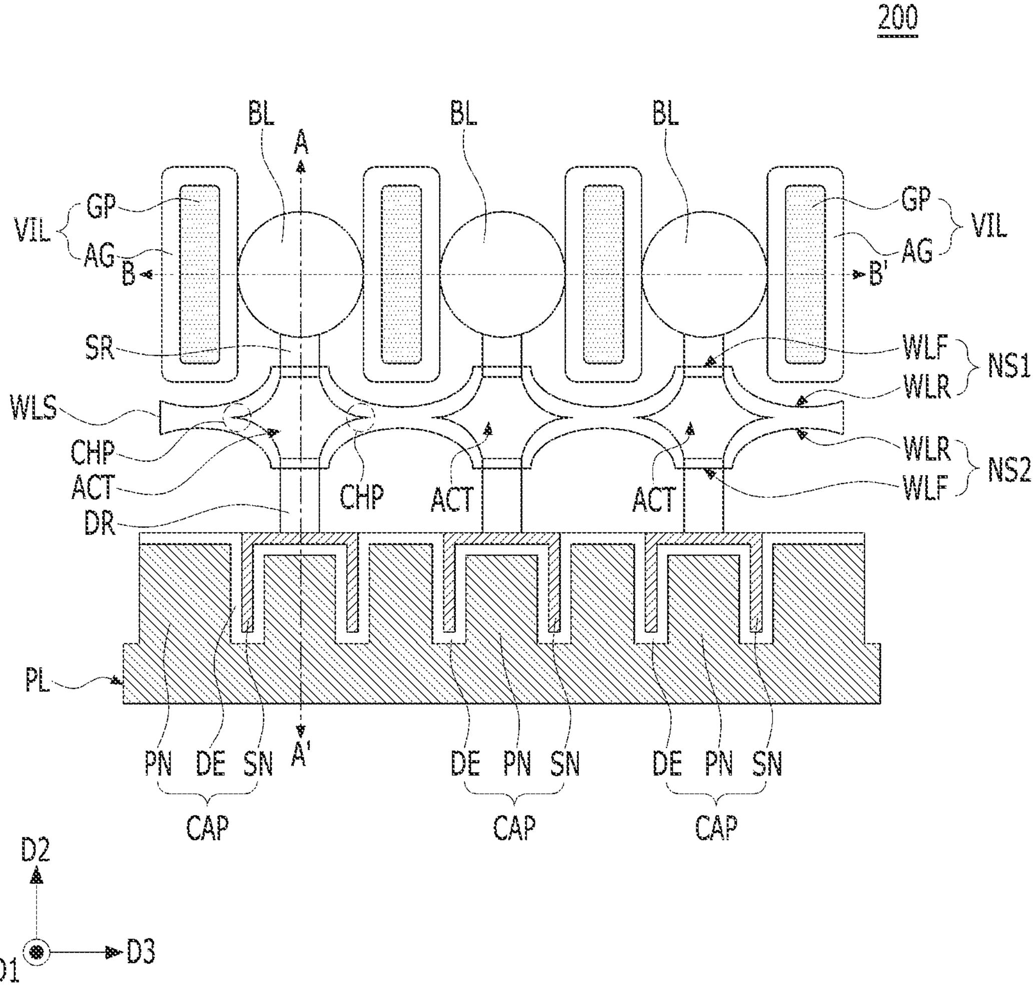
FIG. 7 is a simplified schematic plan view illustrating a semiconductor device in accordance with another embodiment of the present invention.
Figure 8:
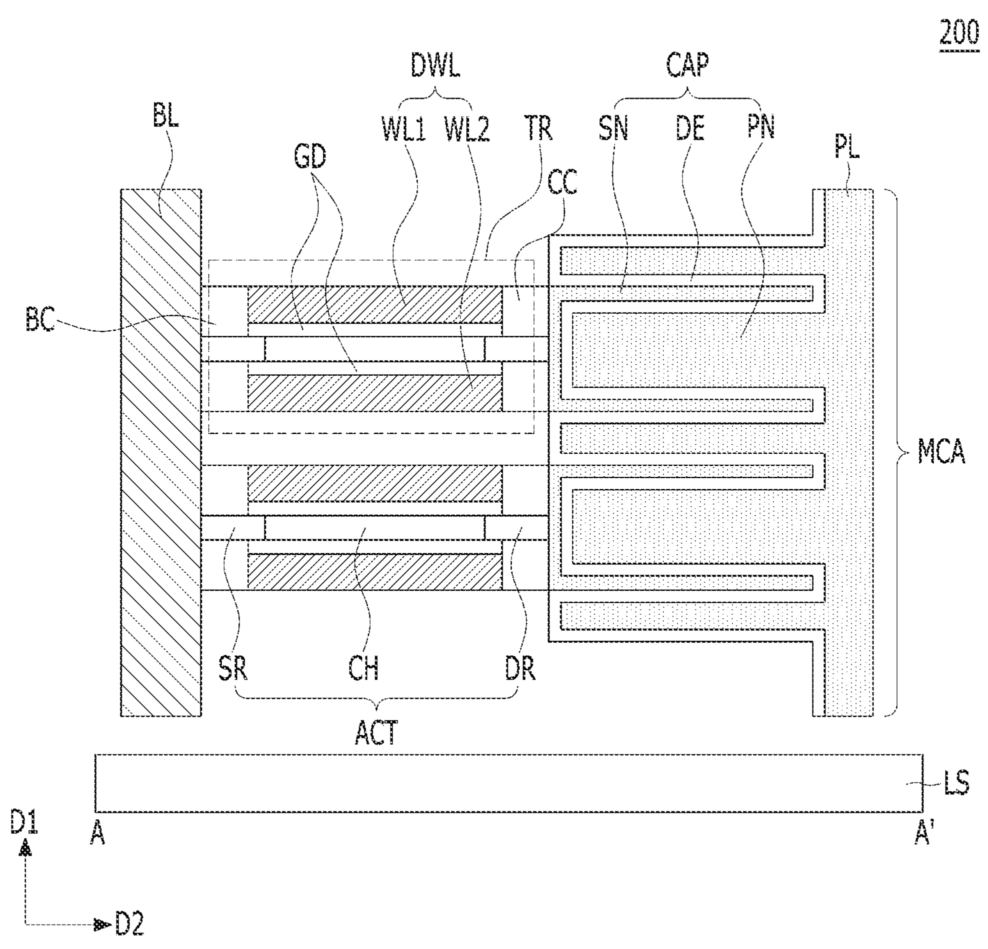
FIG. 8 is a simplified schematic cross-sectional view taken along a line A-A' shown in FIG. 7.
Figure 9:
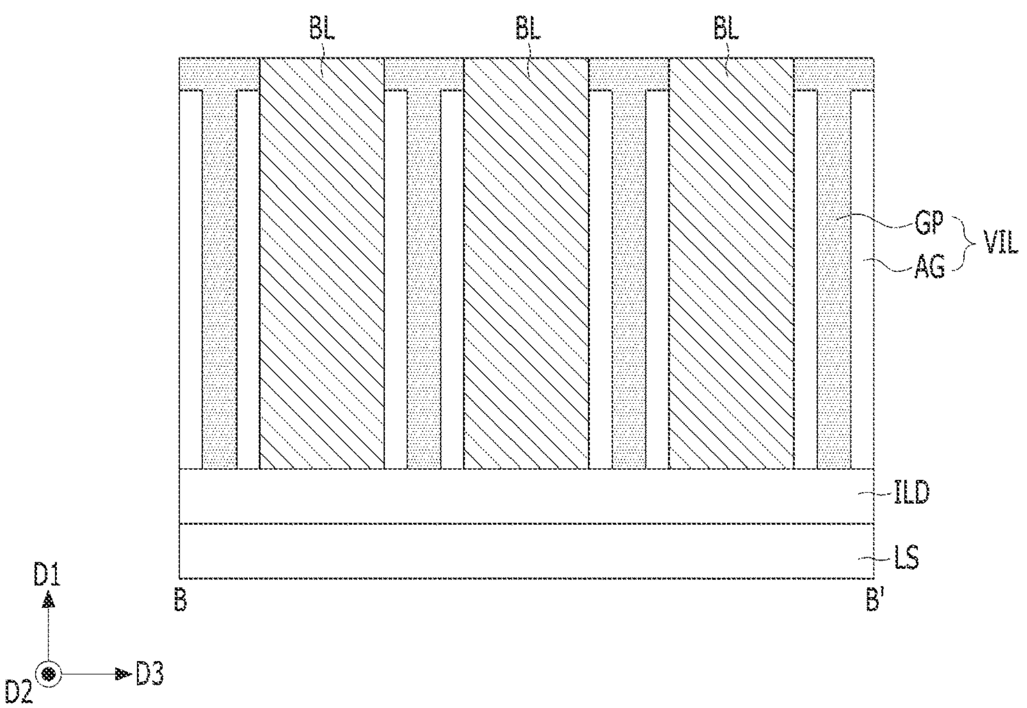
FIG. 9 is a simplified schematic cross-sectional view taken along a line B-B' shown in FIG. 7.

FIG. 7 is a simplified schematic plan view illustrating a semiconductor device in accordance with another embodiment of the present invention. FIG. 8 is a simplified schematic cross-sectional view taken along a line A-A' shown in FIG. 7. FIG. 9 is a simplified schematic cross-sectional view taken along a line B-B' shown in FIG. 7.

Referring to FIG. 7, the semiconductor device 200 may include bit lines BL, capacitors CAP, and a word line stack WLS. The semiconductor device 200 may further include a plurality of vertical isolation layers VIL over the lower structure LS. The vertical isolation layers VIL may be referred to as vertical supporters supporting the bit lines BL. The bit lines BL may be isolated from each other by the vertical isolation layers VIL. The word line stack WLS may extend in the third direction D3. The word line stack WLS may refer to a stack of word lines DWL as described in the above-described embodiments, and an active layer ACT may be disposed between the first word line WL1 and the second word lines WL2 of the word line DWL. The word line stack WLS may be oriented laterally in the third direction D3 between the bit lines BL and the capacitors CAP. The word line stack WLS may include two notched sidewalls NS1 and NS2. Each of the notched sidewalls NS1 and NS2 may include a plurality of flat surfaces WLF and a plurality of recessed surfaces WLR. Active layers ACT overlapping with the word line stack WLS may be formed, and the active layers ACT may have a rhombus shape including channel protrusions CHP.

Referring to FIG. 8, the bit line BL may extend in the first direction D1 over the lower structure LS, and the word lines DWL and the active layers ACT may be stacked in the first direction D1 between the bit line BL and the capacitor CAP. Each of the word lines DWL may include a first word line WL1 and a second word line WL2, and each of the active layers ACT may be disposed between first word lines WL1 and second word lines WL2. A gate dielectric layer GD may be formed between each of the first and second word lines WL1 and WL2 and the active layer ACT. A bit line-side capping layer BC may be disposed between the bit line BL and the word line DWL, and a capacitor-side capping layer CC may be disposed between the word line DWL and the capacitor CAP. The bit line-side capping layer BC and the capacitor-side capping layer CC may include a dielectric material. Each of the capacitors CAP may include a storage node SN, a dielectric layer DE, and a plate node PN, and the plate nodes PN of the capacitors CAP may be commonly coupled to a plate line PL. The plate line PL is referred to also as a common plate. The storage nodes SN of the capacitor CAP may include a cylindrical-shape storage node.

Referring to FIG. 9, an inter-layer dielectric layer ILD may be disposed over the lower structure LS, and a plurality of vertical isolation layers VIL and a plurality of the bit lines BL may be disposed over the inter-layer dielectric layer ILD in an alternating manner along the third direction D3.

The vertical isolation layers VIL may extend in the first direction D1. Each of the vertical isolation layers VIL may include a stack of an air gap AG and a gap-fill layer GP. An air gap AG may surround the sidewall of the gap-fill layer GP. The gap-fill layer GP may include, for example, silicon oxide. The air gap AG may contact the bit lines BL. The air gap AG may be an embedded air gap existing in the vertical isolation layer VIL.

The bit lines BL may be vertically oriented in the first direction D1 between the vertical isolation layers VIL. The vertical isolation layers VIL may be disposed between neighboring bit lines BL. A gap-fill layer GP may be disposed between the bit lines BL that are disposed in the third direction D3. The bit lines BL may extend vertically in the first direction D1 which is parallel to the air gap AG. The gap-fill layers GP may include silicon oxide and may be disposed between neighboring air gaps AG.

According to the above-described embodiment, since the air gap AG is formed in the vertical device isolation layer VIL, the parasitic capacitance between the neighboring bit lines BL may be reduced.

Accordingly, it is possible to reduce the total capacitance between the bit lines and increase the sensing margin.

According to another embodiment of the present invention, an additional air gap may be formed in the active layers ACT between the bit lines BL and the word lines DWL. For example, an additional air gap may be formed in the bit line-side capping layer BC.

FIGS. 10 to 21 are simplified schematic cross-sectional views illustrating a method for fabricating a semiconductor device in accordance with another embodiment of the present invention. FIGS. 10 to 21 illustrate the fabrication method by presenting the simplified schematic cross-sectional views of the semiconductor device taken along a line B-B' of FIG. 7.

Figure 10:
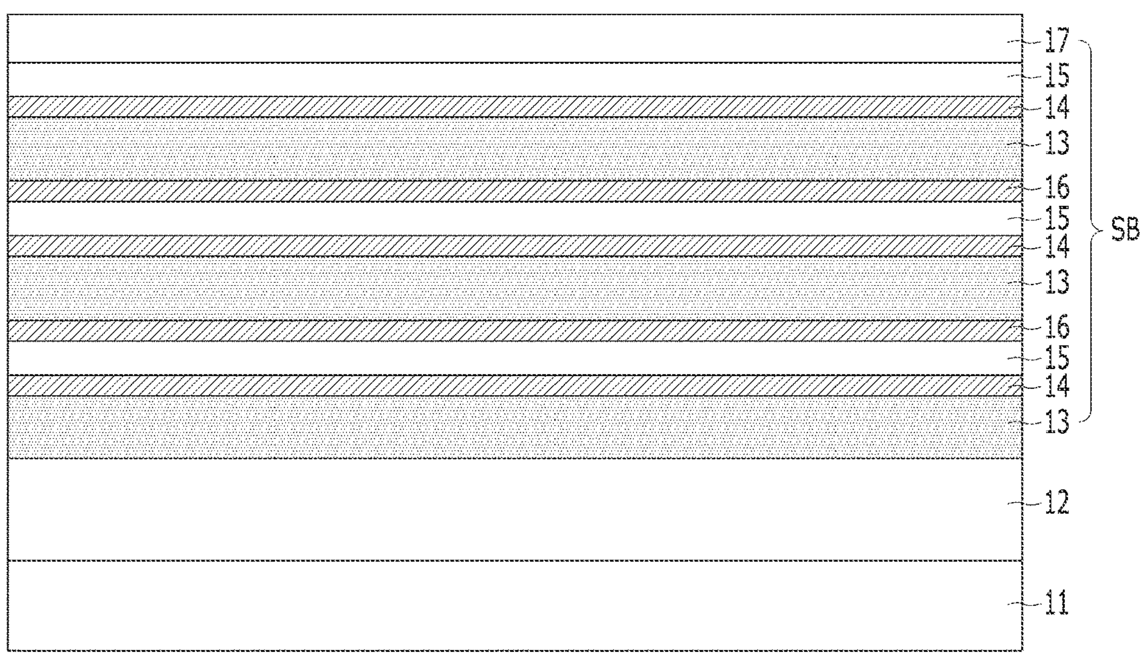
FIGS. 10 to 21 are simplified schematic cross-sectional views illustrating a method for fabricating a semiconductor device in accordance with another embodiment of the present invention.

Referring to FIG. 10, after the inter-layer dielectric layer 12 is formed over the substrate 11, a stack body SB may be formed over the inter-layer dielectric layer 12. The stack body SB may include a sub-stack in which a first dielectric layer 13, a first sacrificial layer 14, a semiconductor layer 15, and a second sacrificial layer 16 are stacked in the mentioned order. In the stack body SB, a plurality of sub-stacks may be alternately and repeatedly stacked. The first dielectric layer 13 may be silicon oxide, and the first and second sacrificial layers 14 and 16 may be silicon nitride. The semiconductor layer 15 may be monocrystalline silicon or polysilicon. According to another embodiment of the present invention, the stack body SB may be formed by alternately stacking a semiconductor layer (a monocrystalline silicon layer) and a silicon germanium layer and then replacing the stack of the semiconductor layer (the monocrystalline silicon layer) and the silicon germanium layer with a sub-stack in which the first dielectric layer 13, the first sacrificial layer 14, the semiconductor layer 15, and the second sacrificial layer 16 are stacked in the mentioned order.

A hard mask layer 17 may be formed on top of the stack body SB.

Figure 11:
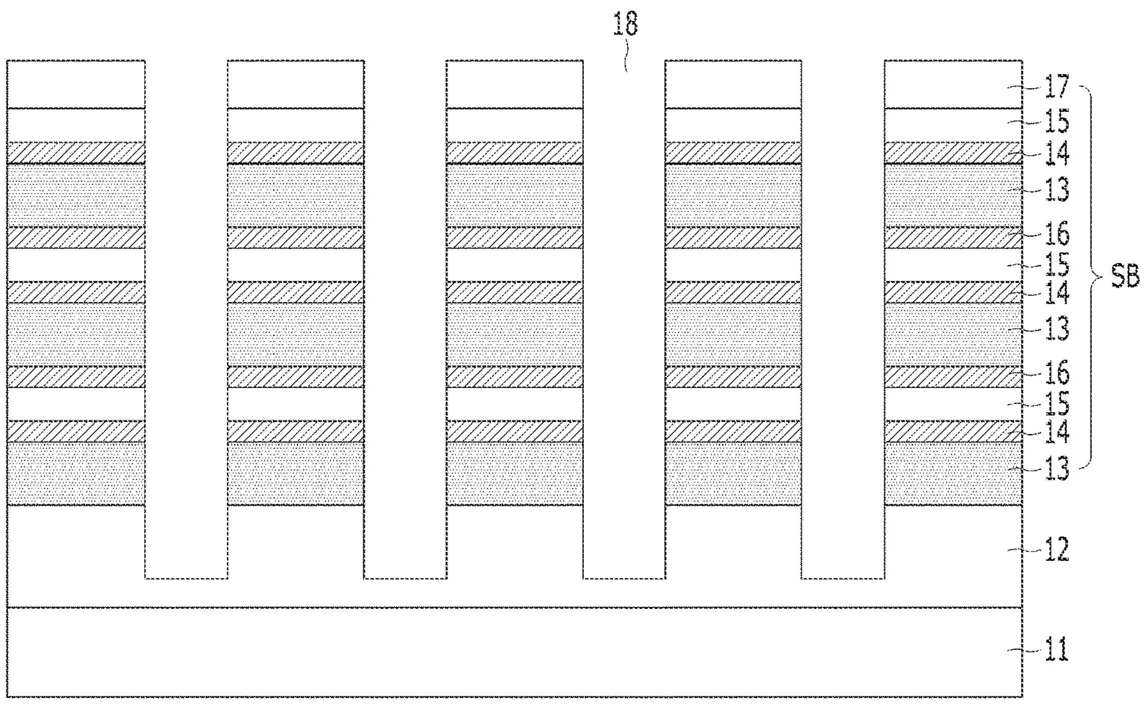

Referring to FIG. 11, openings 18 may be formed by etching the hard mask layer 17 and the stack body SB. The openings 18 may extend into the inter-layer dielectric layer 12. The openings 18 may provide the space for forming the device isolation layers, and the openings 18 may have a trench shape.

Figure 12:
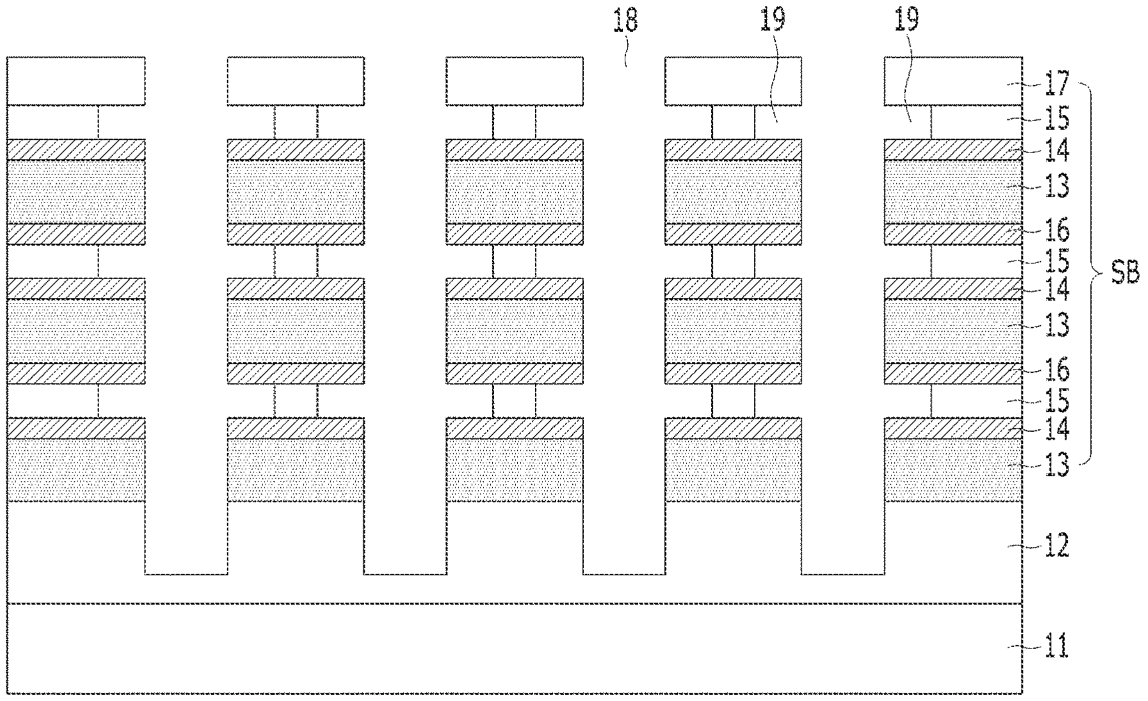

Referring to FIG. 12, the semiconductor layers 15 may be selectively etched to form recesses 19.

Figure 13:
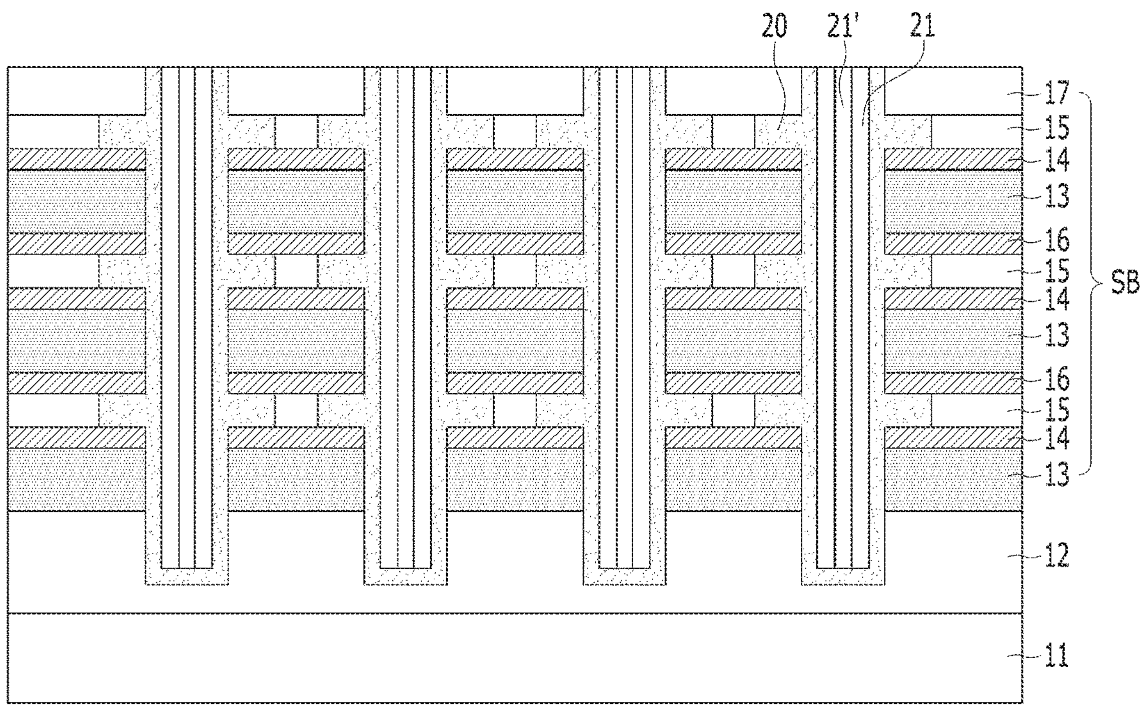

Referring to FIG. 13, a liner layer 20 may be formed to fill the recesses 19 and also line the interior of the openings 18. The liner layer 20 may include, for example, silicon oxide.

A sacrificial spacer 21 may be formed over the liner layer 20 inside the openings 18. A silicon nitride deposition process and an etch-back process may be performed to form the sacrificial spacer 21.

A sacrificial gap-fill layer 21' may be formed over the sacrificial spacer 21 to fill the openings 18. The sacrificial gap-fill layer 21' may include, for example, silicon oxide. Subsequently, the sacrificial gap-fill layer 21' may be planarized to expose the top surface of the hard mask layer 17.

Figure 14:
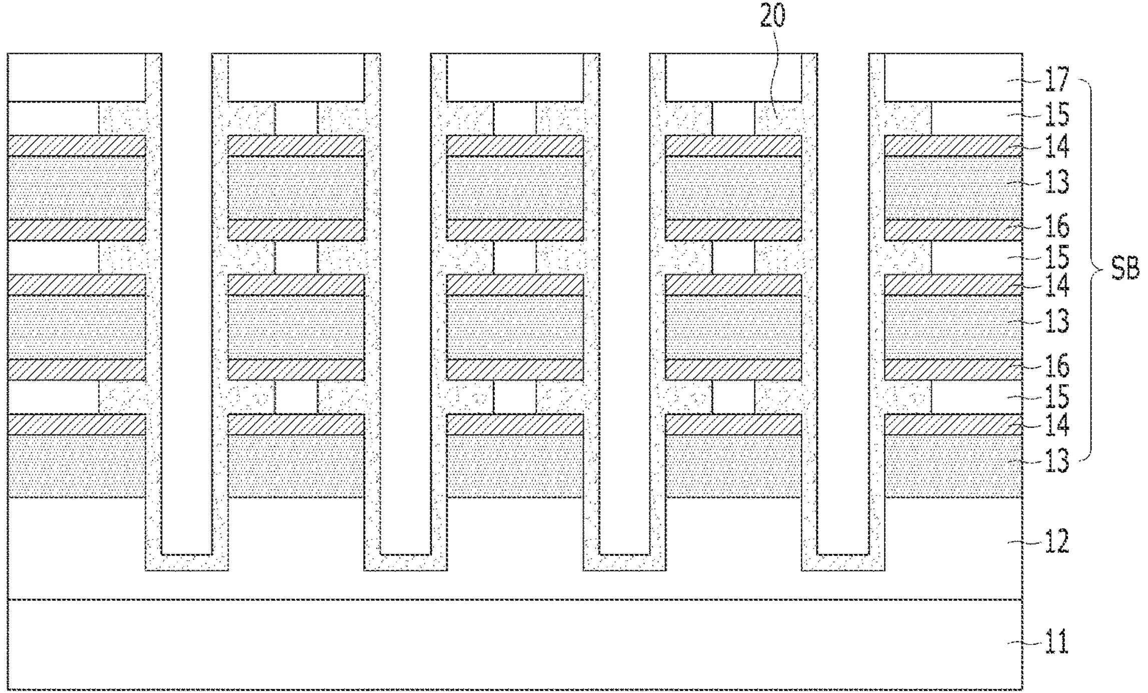

Referring to FIG. 14, the sacrificial gap-fill layer 21' and the sacrificial spacer 21 may be removed.

Figure 15:
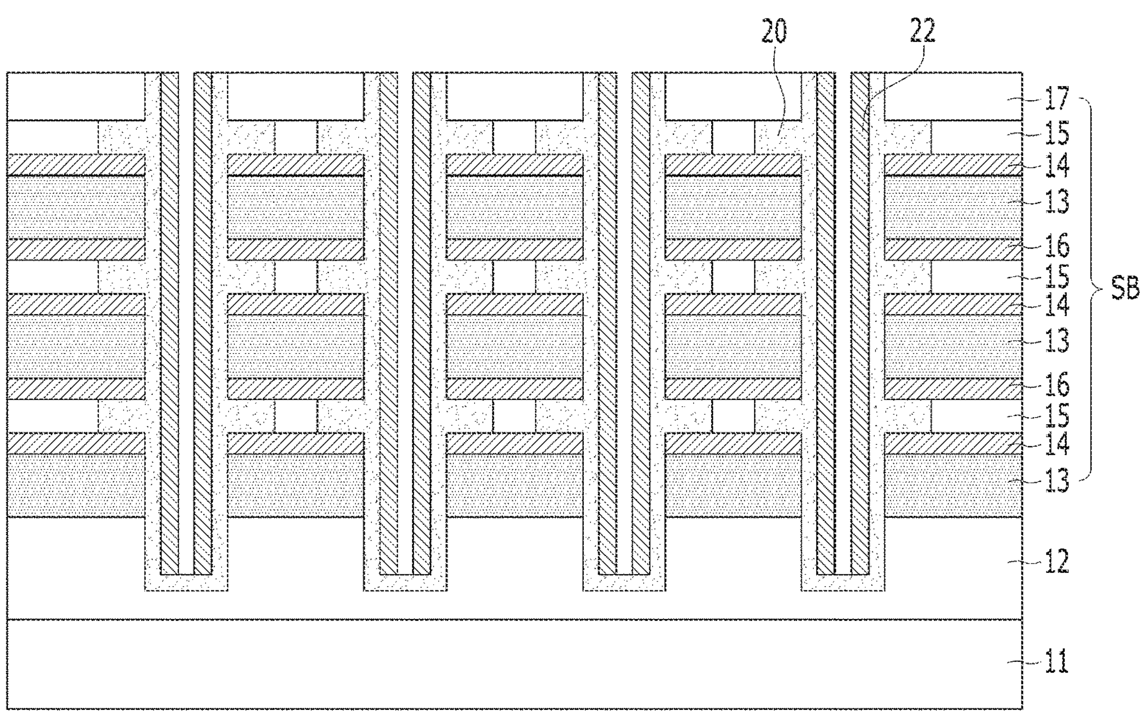

Referring to FIG. 15, an amorphous carbon spacer 22 may be formed over the liner layer 20. In order to form the amorphous carbon spacer 22, an amorphous carbon layer deposition process and an etch-back process may be performed.

Figure 16:
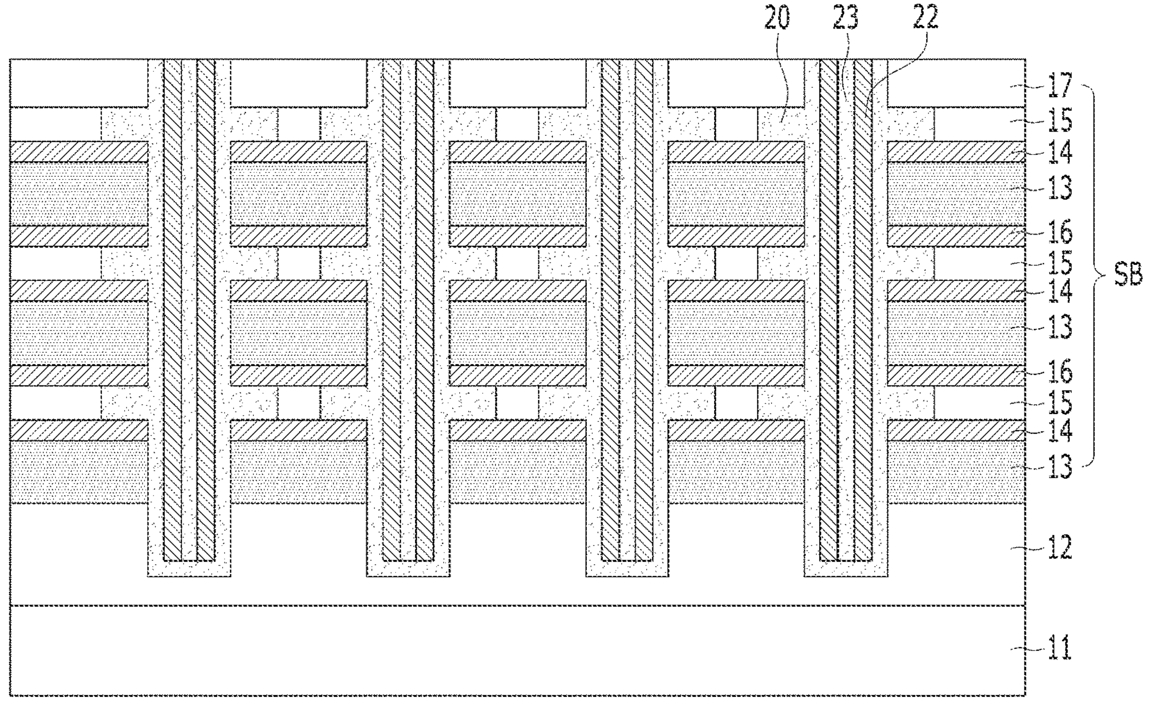

Referring to FIG. 16, a gap-fill layer 23 may be formed over the amorphous carbon spacer 22. The gap-fill layer 23 may include, for example, silicon oxide. Subsequently, the gap-fill layer 23 may be planarized to expose the top surface of the hard mask layer 17.

Figure 17:
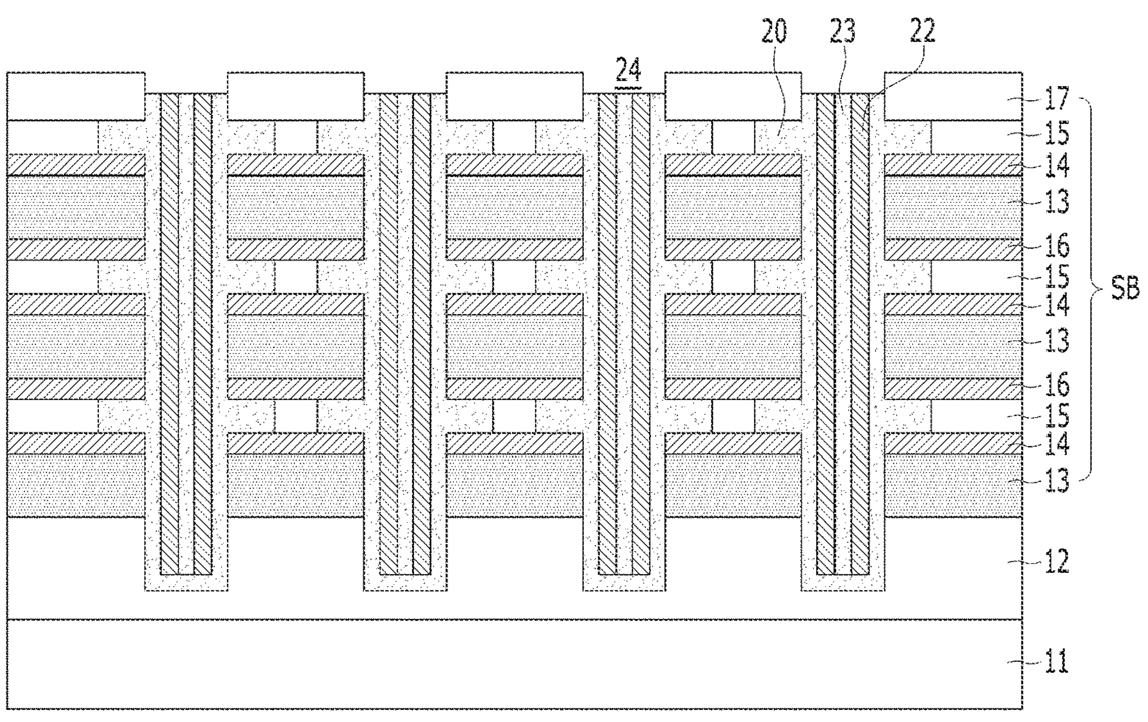

Referring to FIG. 17, a portion of the gap-fill layer 23, the amorphous carbon spacer 22, and the liner layer 20 may be recessed to form the recessed surface 24.

Figure 18:
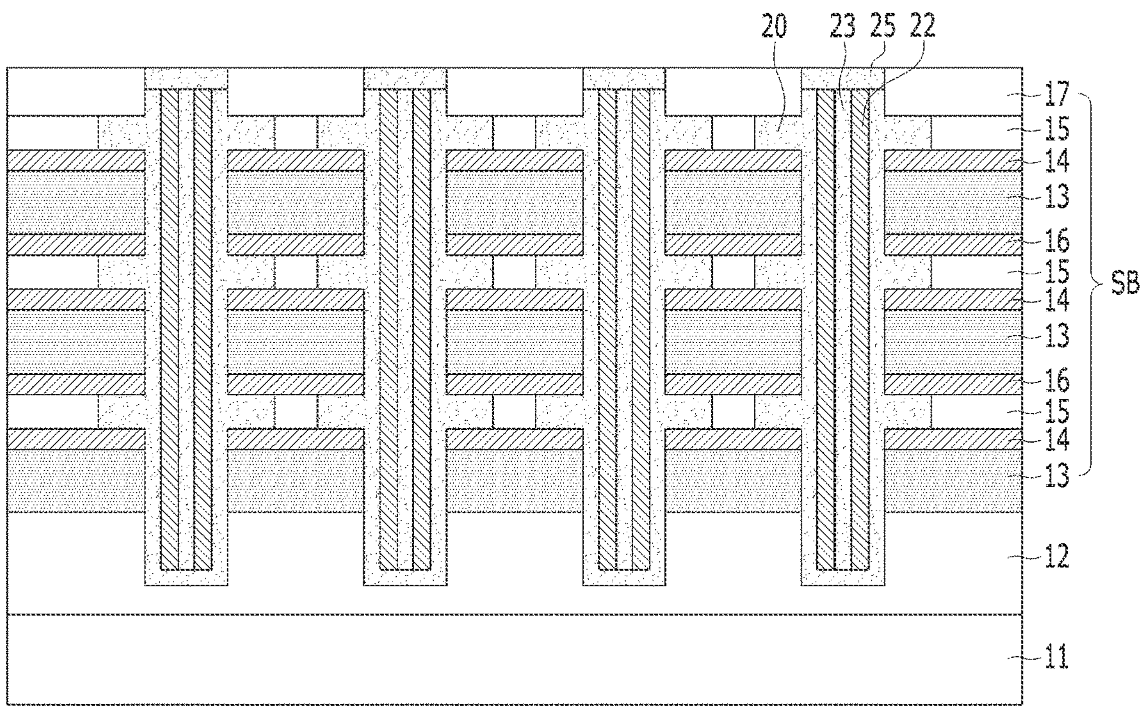

Referring to FIG. 18, a capping layer 25 filling the recessed surface 24 may be formed. The capping layer 25 may include, for example, silicon oxide.

Figure 19:
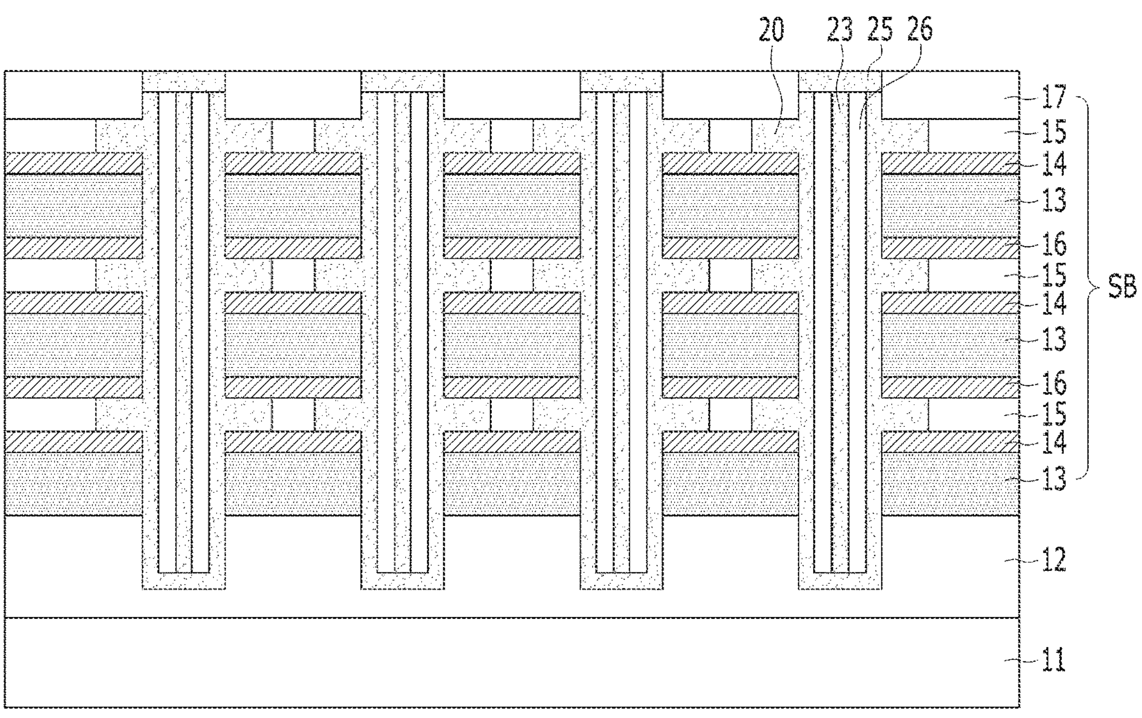

Referring to FIG. 19, an air gap 26 may be formed by removing the amorphous carbon spacer 22. Plasma treatment may be performed in the atmosphere of oxygen in order to remove the amorphous carbon spacer 22. The amorphous carbon spacer 22 may be removed by being decomposed and volatilized in the atmosphere of oxygen. The air gap 26 may surround the gap-fill layer 23.

The air gap 26 may be sealed airtight from the outside by the liner layer 20, the gap-fill layer 23, and the capping layer 25. Since the liner layer 20, the gap-fill layer 23, and the capping layer 25 include silicon oxides, the air gap 26 may have a shape embedded in the inside of the silicon oxide structure.

Figure 20:
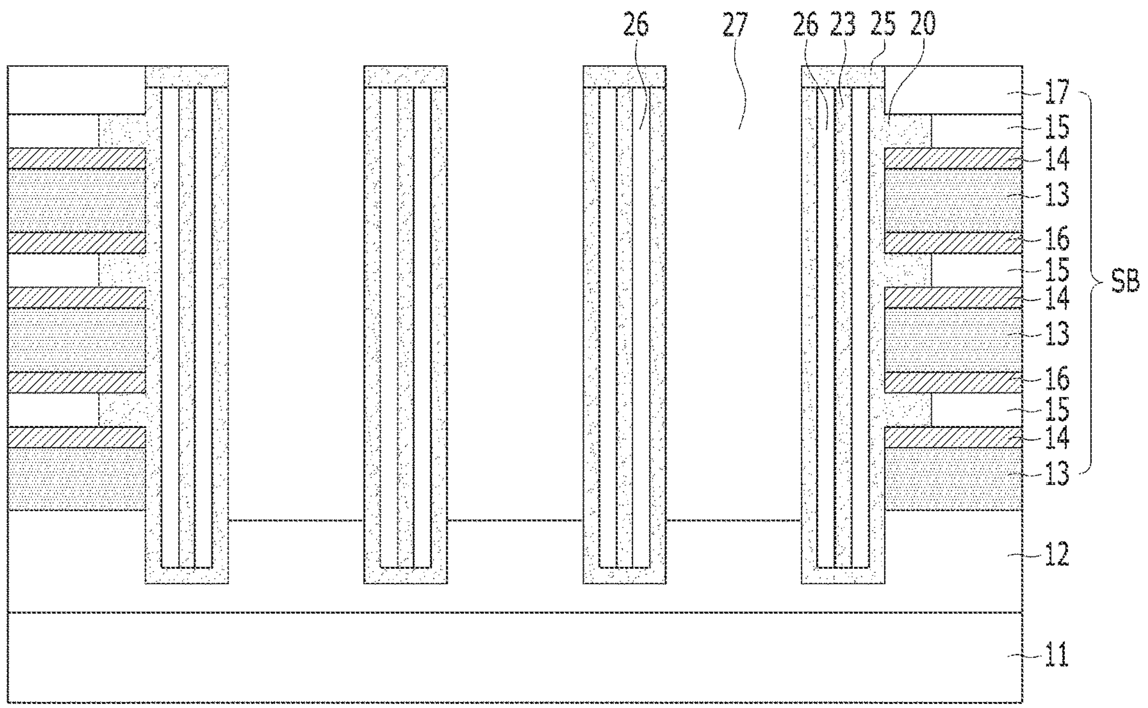

Referring to FIG. 20, bit line openings 27 may be formed by etching portions of the stack body SB. Portions of the stack body SB between the air gaps 26, e.g., the first dielectric layers 13, the first sacrificial layers 14, the semiconductor layers 15, and the second sacrificial layers 16 may be etched to form the bit line openings 27. The liner layers 20 on the sidewalls of the bit line openings 27 may be exposed, and thus the air gaps 26 may not be exposed through the bit line openings 27. According to another embodiment of the present invention, the liner layers 20 may be removed from the sidewalls of the bit line openings 27.

Figure 21:
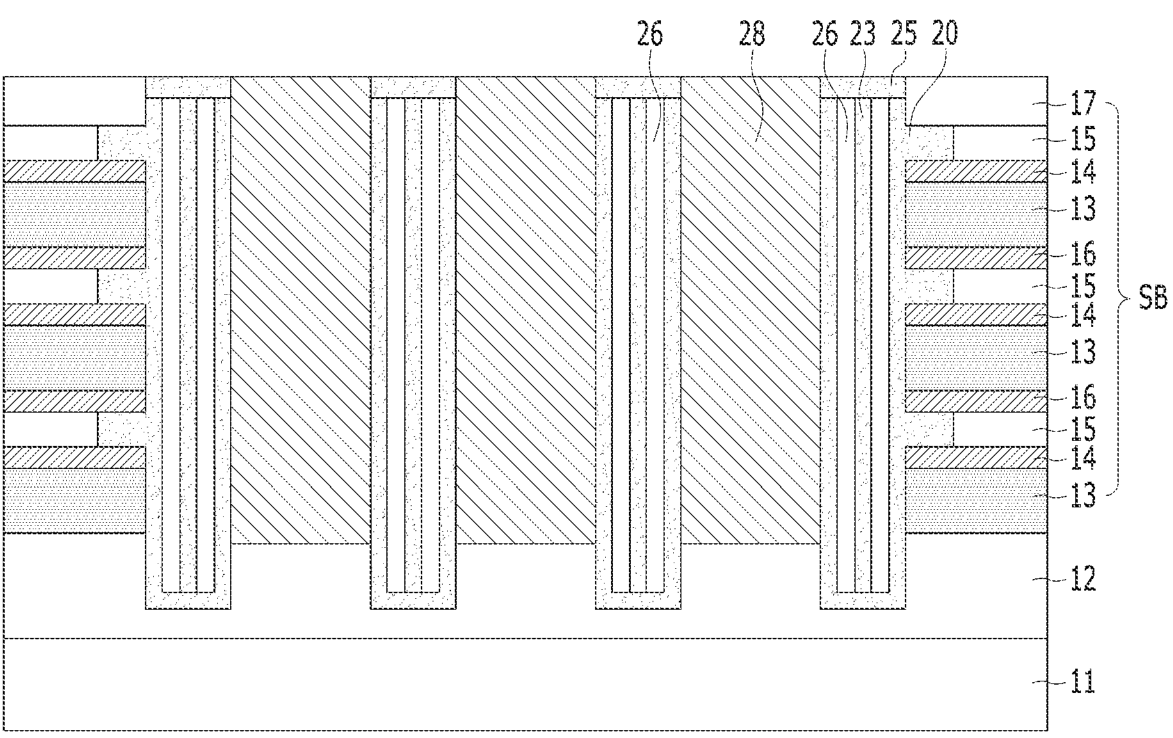

Referring to FIG. 21, bit lines 28 may be formed to fill the bit line openings 27. The bit lines 28 may include a silicon-based material, a metal-based material, or a combination thereof. The bit line 28 may include silicon, a metal, a metal nitride, a metal silicide, or a combination thereof. The bit lines 28 may include polysilicon, titanium nitride, tungsten, or a combination thereof. For example, the bit lines 28 may include polysilicon or titanium nitride (TiN) which is doped with an N-type impurity. The bit lines 28 may include a TiN/W stack including titanium nitride and tungsten over the titanium nitride.

According to another embodiment of the present invention, before the bit lines 28 are formed, the active layer ACT and the word line DWL, which are described above by referring to FIGS. 7 and 8, may be formed.

According to another embodiment of the present invention, after the bit lines 28 are formed, capacitors CAP, which are described above by referring to FIGS. 7 and 8, may be formed.

Figure 22:
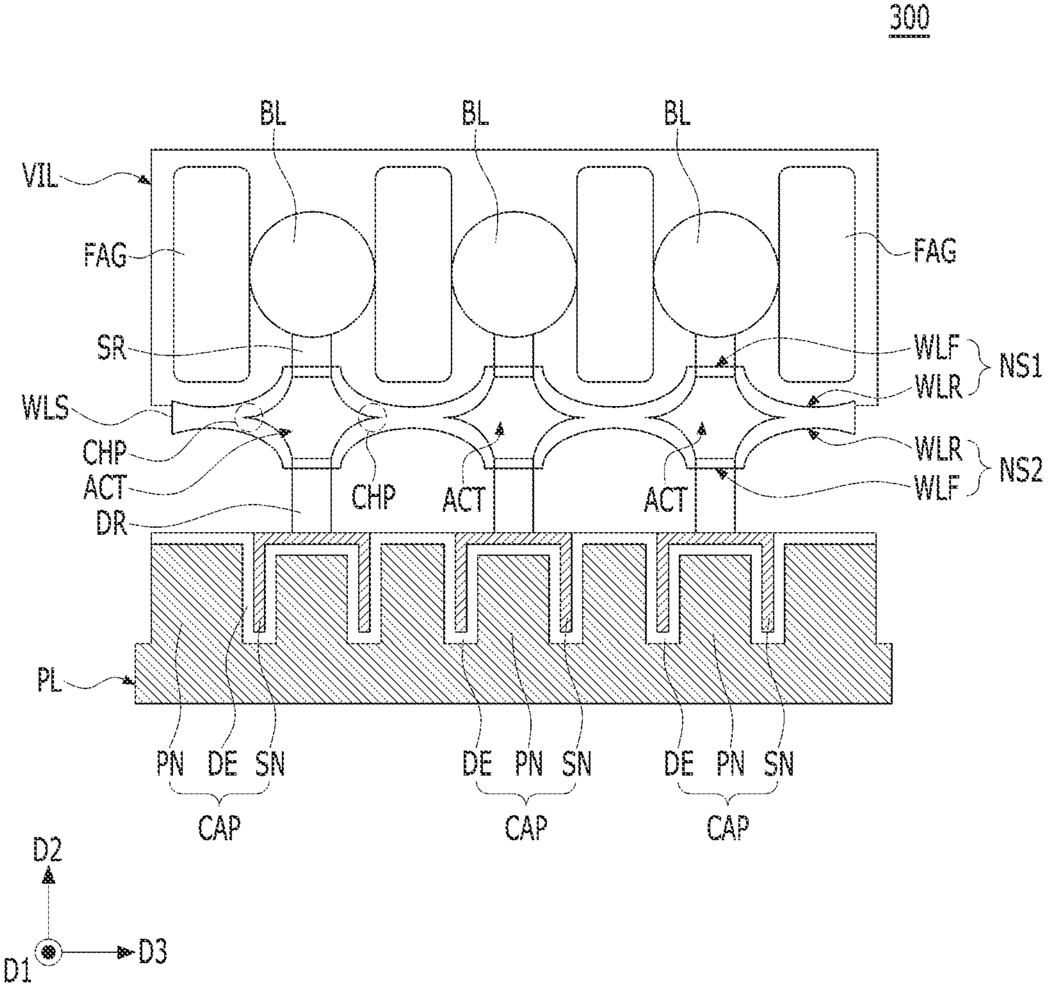
FIG. 22 is a simplified schematic plan view illustrating a semiconductor device in accordance with another embodiment of the present invention.

FIG. 22 is a simplified schematic plan view of a semiconductor device in accordance with another embodiment of the present invention. The semiconductor device shown in FIG. 22 may be similar to the semiconductor device shown in FIG. 7.

Referring to FIG. 22, the semiconductor device 300 may include a vertical isolation layer VIL, and the vertical isolation layer VIL may include air gaps FAG disposed between the bit lines BL. The air gaps FAG may be embedded air gaps existing in the vertical isolation layer VIL. A gap-fill layer may not be formed inside the air gaps FAG. As described, the air gaps FAG may be disposed between the neighboring bit lines BL, and the air gaps FAG and the bit lines BL may directly contact each other.

Figure 23:
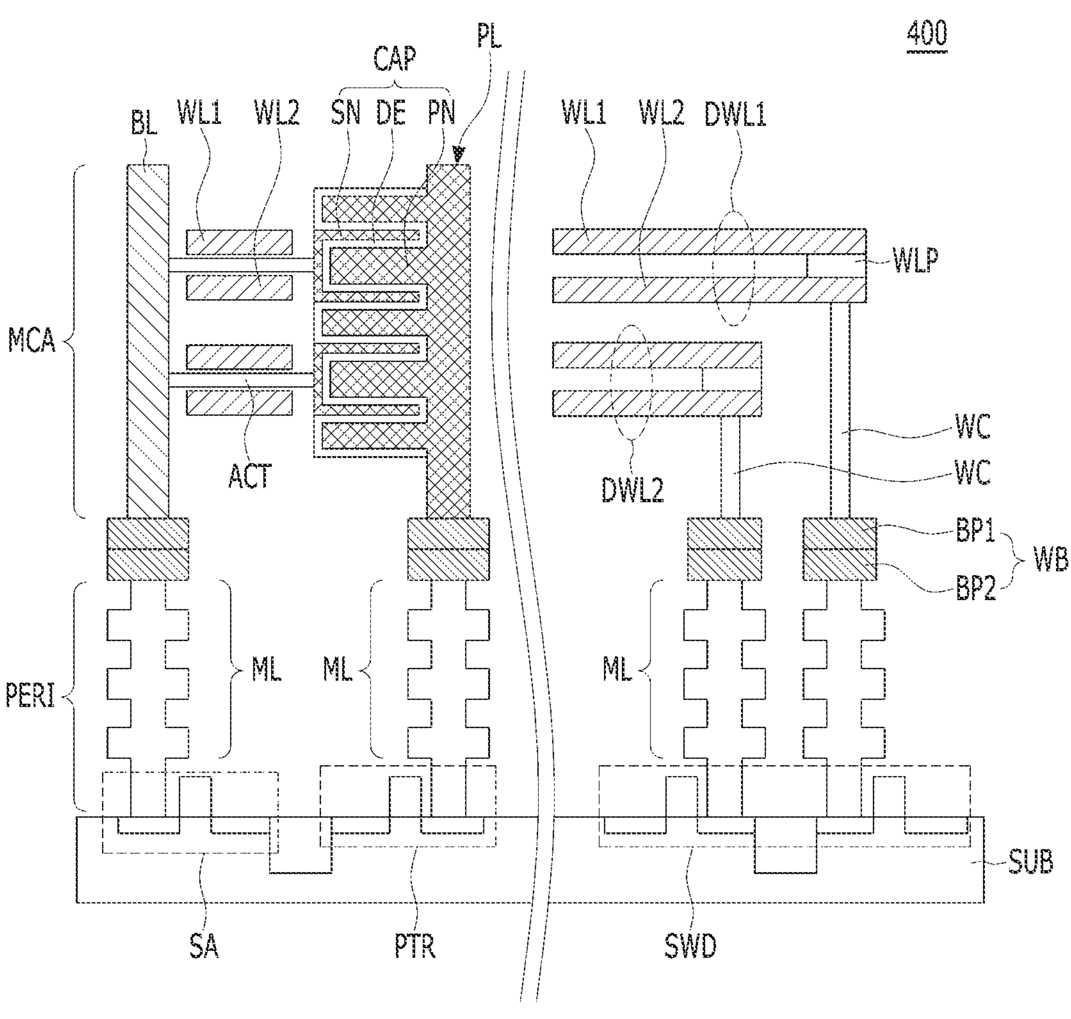
FIG. 23 is a simplified schematic cross-sectional view illustrating a semiconductor device in accordance with another embodiment of the present invention.

FIG. 23 is a simplified schematic cross-sectional view of a semiconductor device in accordance with another embodiment of the present invention.

Referring to FIG. 23, the semiconductor device 400 may include a peripheral circuit portion PERI and a memory cell array MCA. The memory cell array MCA may be disposed over the peripheral circuit portion PERI. The memory cell array MCA and the peripheral circuit portion PERI may be coupled, for example, by wafer bonding. The semiconductor device 400 may have a COP (Cell-Over-Peripheral) structure.

The memory cell array MCA may include a plurality of memory cells. The memory cell array MCA may include a bit line BL, a plurality of word lines DWL1 and DWL2, and a plurality of capacitors CAP. Each of the word lines DWL1 and DWL2 may have a double word line structure including a first word line WL1 and a second word line WL2. One active layer ACT may be disposed between the first word line WL1 and the second word line WL2. Each capacitor CAP may include a storage node SN, a dielectric layer DE, and a plate node PN. The plate nodes PN of the vertically stacked capacitors CAP may be commonly coupled to the plate line PL.

The edge portions of the word lines DWL1 and DWL2 may have a stepped structure. Edge portions of the word lines DWL1 and DWL2 may further include word line pads WLP. Each of the word line pads WLP may be disposed between an edge portion of the first word line WL1 and an edge portion of the second word line WL2. The first word line WL1 and the second word line WL2 may be electrically connected to each other by the word line pads WLP. Edge portions of the word lines DWL1 and DWL2 may be respectively coupled to the contact plugs WC.

A bonding structure WB may be disposed between the peripheral circuit portion PERI and the memory cell array MCA. The bonding structure WB may include first bonding pads BP1 and second bonding pads BP2. The memory cell array MCA and the peripheral circuit portion PERI may be coupled to each other through metal-to-metal bonding. The memory cell array MCA and the peripheral circuit portion PERI may be coupled to each other through hybrid bonding. For example, memory cell array MCA and the peripheral circuit portion PERI may be coupled to each other through the first bonding pads BP1 and the second bonding pads BP2. Metal-to-metal bonding may refer to direct bonding between the first and second bonding pads BP1 and BP2, and hybrid bonding may refer to a combination of metal-to-metal bonding and dielectric bonding. The first and second bonding pads BP1 and BP2 may include a metal material.

The bit line BL and the plate line PL may be respectively coupled to the first bonding pads BP1. The edge portions of the word lines DWL1 and DWL2 may be respectively coupled to the first bonding pad BP1 through the contact plugs WC.

The peripheral circuit portion PERI may include a plurality of control circuits and a plurality of interconnections ML formed over a substrate SUB. For example, the peripheral circuit portion PERI may include a sense amplifier SA, a sub-word line driver SWD, and a plate line control circuit PTR. The sense amplifier SA may be coupled to the bit line BL through the interconnection ML. The sub-word line driver SWD may be coupled to the word lines DWL1 and DWL2 through the interconnection ML. The plate line control circuit PTR may be coupled to the plate line PL through the interconnection ML.

The semiconductor device 400 of FIG. 23 may further include vertical isolation layers including air gaps. Here, as for the vertical isolation layers, FIGS. 1 to 22 may be referred to.

According to another embodiment of the present invention, the semiconductor device 400 may have a POC (Peripheral-Over-Cell) structure. The POC structure may refer to a structure in which the peripheral circuit portion PERI is disposed over the memory cell array MCA.

According to an embodiment of the present invention, since an air gap is formed in a supporter or an isolation layer, it is possible to reduce parasitic capacitance between the neighboring bit lines.

The effects desired to be obtained in the embodiments of the present invention are not limited to the effects mentioned above, and other effects not mentioned above may also be clearly understood by those of ordinary skill in the art to which the present invention pertains from the description below.

While the present invention has been described with respect to specific embodiments, it will be apparent to those skilled in the art that various changes and modifications may be made without departing from the spirit and scope of the invention as defined in the following claims.

What is claimed is:

1. A semiconductor device of a three-dimensional structure, comprising:

a plurality of bit lines vertically oriented over a substrate; and a plurality of vertical isolation layers disposed between the bit lines, the vertical isolation layers each including an air gap extending vertically, an active layer oriented laterally from the bit lines, a word line which is oriented laterally in a direction crossing the active layer.

2. The semiconductor device of claim 1, wherein each of the vertical isolation layers further includes a gap-fill layer, and wherein the first-air gap is disposed between the gap-fill layer and the bit.

3. The semiconductor device of claim 2, wherein the gap-fill layer includes silicon oxide.

4. The semiconductor device of claim 1, wherein the bit lines extend vertically in a direction parallel to the air gap.

5. The semiconductor device of claim 1, further comprising:

a data storage element including a storage node which is coupled to a semiconductor layer.

6. The semiconductor device of claim 1, further comprising:

a bit line-side capping layer disposed between the conductive line and the lateral conductive line, and an additional air gap formed in the bit line-side capping layer.

7. The semiconductor device of claim 1, wherein each of the vertical isolation layers further includes:

an additional air gap formed in the active layer between the bit lines and the word line.

8. The semiconductor device of claim 1, wherein each of the vertical isolation layers further includes a gap-fill layer, including:

a first portion extending vertically oriented to fill a space between adjacent ones of the air gaps; and a second portion protruding laterally to cap top ends of the air gaps.

9. A semiconductor device of a three-dimensional structure, comprising:

active layers vertically stacked over a substrate;

word lines extending in a direction crossing the active layers over the active layers;

bit lines commonly coupled to first sides of the active layers and extending in a direction perpendicular to the substrate;

storage nodes of a data storage element that are vertically stacked over the substrate while being coupled to second sides of the active layers, respectively; and vertical isolation layers including air gaps disposed between the bit lines.

10. The semiconductor device of claim 9, wherein each of the vertical isolation layers further includes:

a gap-fill layer, and the air gaps which are disposed between the gap-fill layer and the bit lines.

11. The semiconductor device of claim 10, wherein the gap-fill layer includes silicon oxide.

12. The semiconductor device of claim 9, wherein the bit lines extend vertically in a direction parallel to the air gaps.

13. The semiconductor device of claim 9, wherein each of the word lines includes double word lines that are facing each other with the active layer interposed therebetween.

14. The semiconductor device of claim 9, wherein the storage nodes of the data storage element include a cylindrical storage node.

15. The semiconductor device of claim 9, wherein each of the active layers has a rhombus shape including a channel protrusion.

16. The semiconductor device of claim 9, further comprising:

a bit line-side capping layer disposed between the conductive line and the lateral conductive line, and an additional air gap formed in the bit line-side capping layer.

17. The semiconductor device of claim 9, wherein each of the vertical isolation layers further includes:

an additional air gap formed in the active layer between the bit lines and the word lines.

18. The semiconductor device of claim 9, wherein each of the vertical isolation layers further includes a gap-fill layer, including:

a first portion extending vertically oriented to fill a space between adjacent ones of the air gaps; and a second portion protruding laterally to cap top ends of the air gaps.

* * * * *